United States Patent
Sheng et al.

(10) Patent No.: US 9,627,274 B1
(45) Date of Patent: Apr. 18, 2017

(54) METHODS OF FORMING SELF-ALIGNED CONTACTS ON FINFET DEVICES

(71) Applicant: GLOBALFOUNDRIES Inc., Grand Cayman (KY)

(72) Inventors: Haifeng Sheng, Rexford, NY (US); Xintuo Dai, Rexford, NY (US); Jinping Liu, Ballston Lake, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/214,670

(22) Filed: Jul. 20, 2016

(51) Int. Cl.
*H01L 21/8238* (2006.01)
*H01L 21/02* (2006.01)
(Continued)

(52) U.S. Cl.
CPC ........ *H01L 21/823871* (2013.01); *H01L 21/02123* (2013.01); *H01L 21/02126* (2013.01); *H01L 21/02164* (2013.01); *H01L 21/31111* (2013.01); *H01L 21/823431* (2013.01); *H01L 21/823821* (2013.01); *H01L 29/665* (2013.01); *H01L 21/845* (2013.01); *H01L 29/66795* (2013.01);
(Continued)

(58) Field of Classification Search
CPC ....... H01L 21/823821; H01L 21/02532; H01L 21/02661; H01L 21/02636; H01L 21/02529; H01L 21/2652; H01L 21/02521; H01L 21/02634; H01L 21/02587; H01L 21/0243; H01L 21/2086; H01L 21/823871; H01L 21/02123; H01L 21/02126; H01L 21/31111; H01L 21/02164; H01L 29/665; H01L 21/823431; H01L 21/845; H01L 21/2018; H01L 21/2022; H01L 21/2033; H01L 21/2036; H01L 21/2053; H01L 21/2056; H01L 21/2085; H01L 29/785; H01L 29/786

See application file for complete search history.

(56) References Cited

U.S. PATENT DOCUMENTS

2010/0127323 A1* 5/2010 Chung ............... H01L 24/05
257/334
2015/0279972 A1* 10/2015 Xie ................ H01L 29/66795
438/283
(Continued)

*Primary Examiner* — Thanh T Nguyen
(74) *Attorney, Agent, or Firm* — Amerson Law Firm, PLLC

(57) ABSTRACT

One illustrative method disclosed herein includes, among other things, forming a first sacrificial layer comprising amorphous silicon or polysilicon material around a fin in a lateral space between a plurality of laterally spaced apart gate structures that are positioned around the fin, performing a first selective etching process to remove a first sacrificial layer selectively relative to surrounding material so as to expose the fin in the lateral space, forming an epi material on the exposed portion of the fin, and forming a second layer of a sacrificial material above the epi material. The method also includes selectively removing the second layer of sacrificial material relative to at least the first layer of material to thereby define a source/drain contact opening that exposes the epi material and forming a self-aligned trench conductive source/drain contact structure that is conductively coupled to the epi material.

22 Claims, 19 Drawing Sheets

(51) Int. Cl.
*H01L 21/311* (2006.01)
*H01L 29/66* (2006.01)
*H01L 21/8234* (2006.01)
H01L 29/786 (2006.01)
H01L 21/84 (2006.01)
H01L 29/78 (2006.01)

(52) U.S. Cl.
CPC .......... *H01L 29/785* (2013.01); *H01L 29/786* (2013.01); *H01L 29/7856* (2013.01)

(56) References Cited

U.S. PATENT DOCUMENTS

| | | | | |
|---|---|---|---|---|
| 2015/0318398 | A1* | 11/2015 | Xie | H01L 29/78 257/288 |
| 2015/0340497 | A1* | 11/2015 | Xie | H01L 29/7848 257/77 |
| 2016/0133623 | A1* | 5/2016 | Xie | H01L 27/088 257/384 |

* cited by examiner

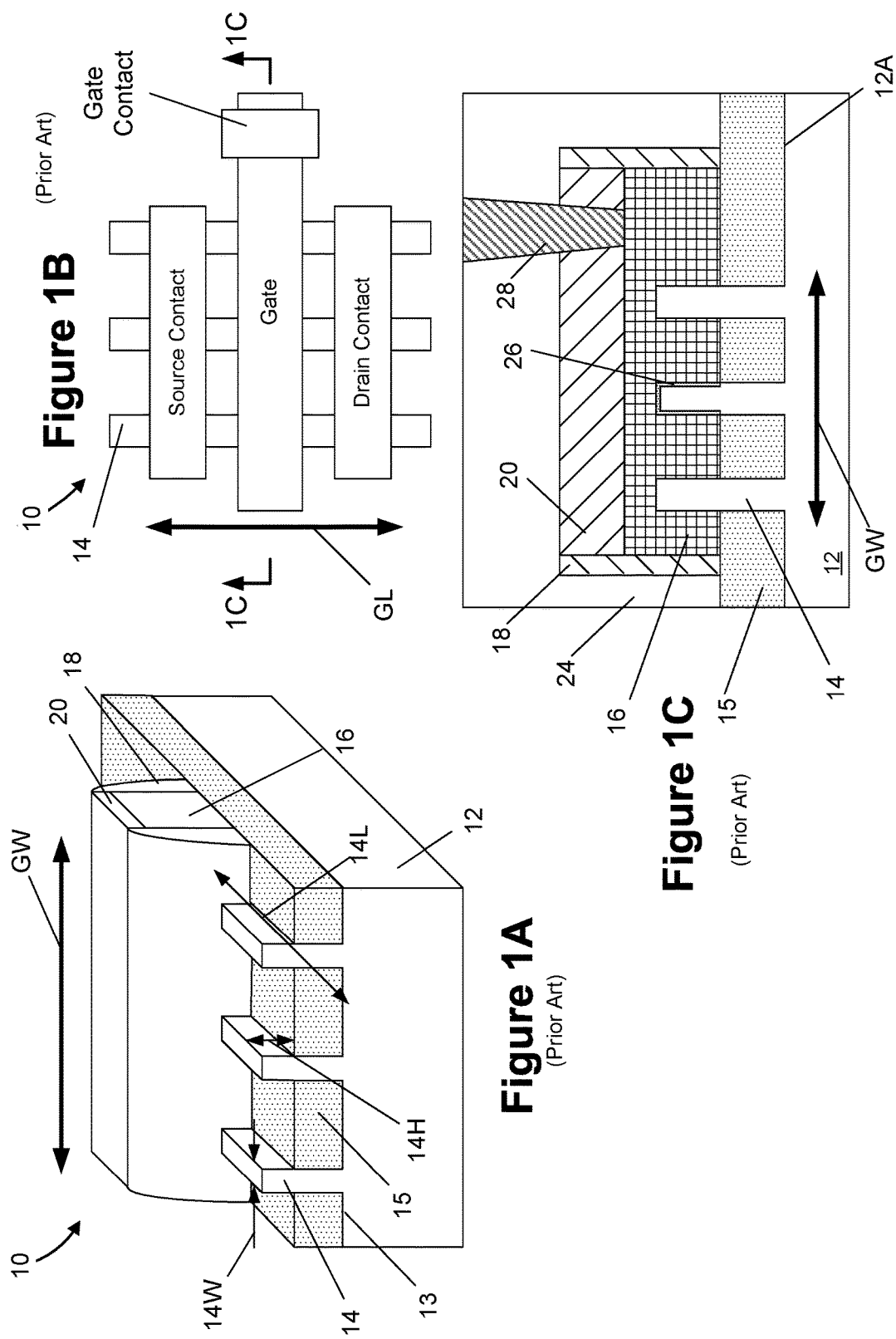

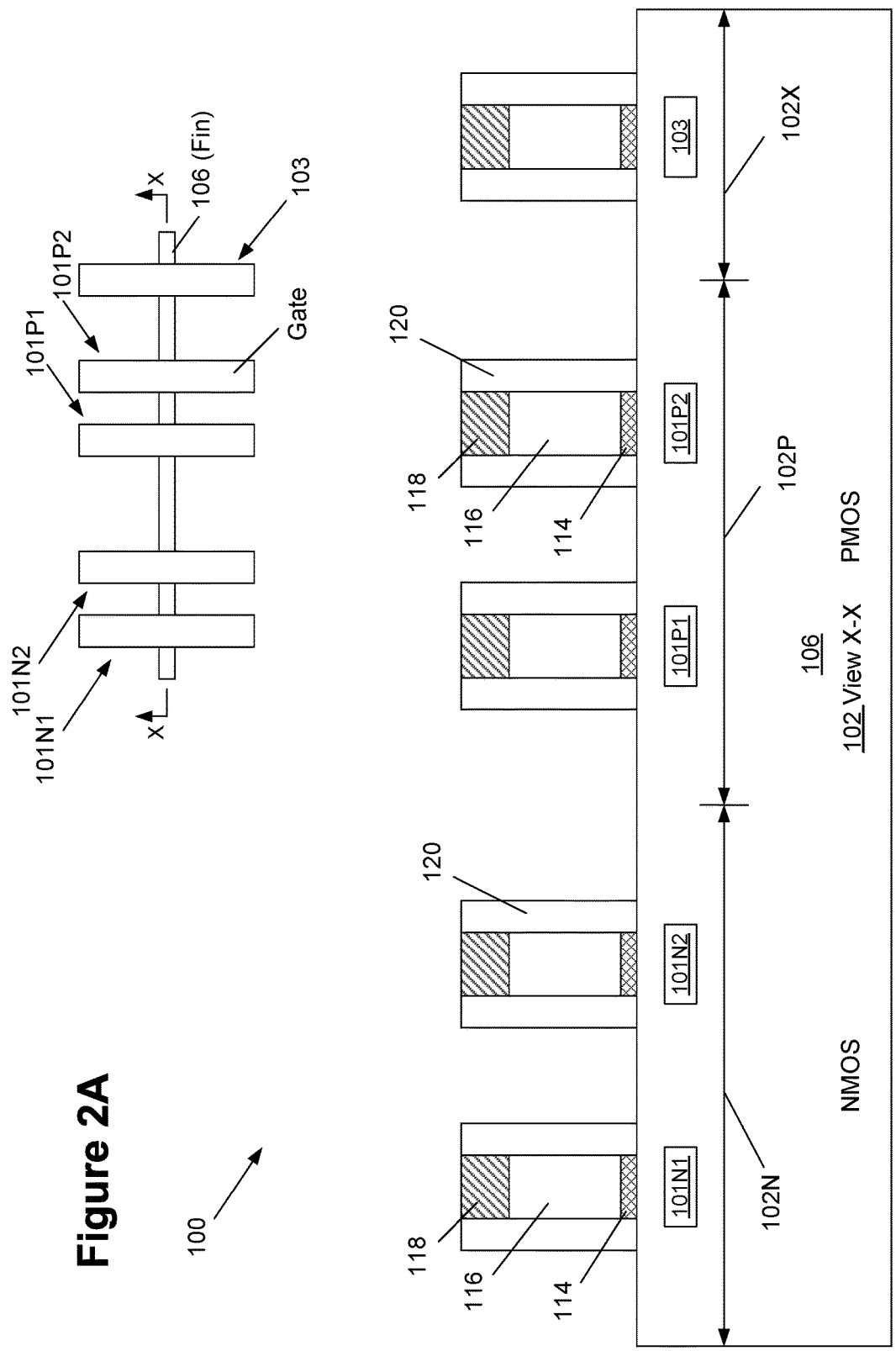

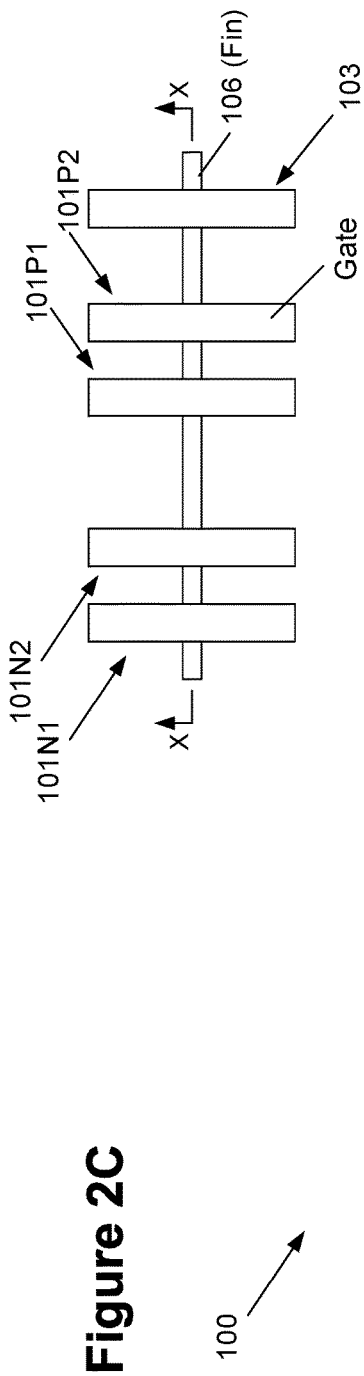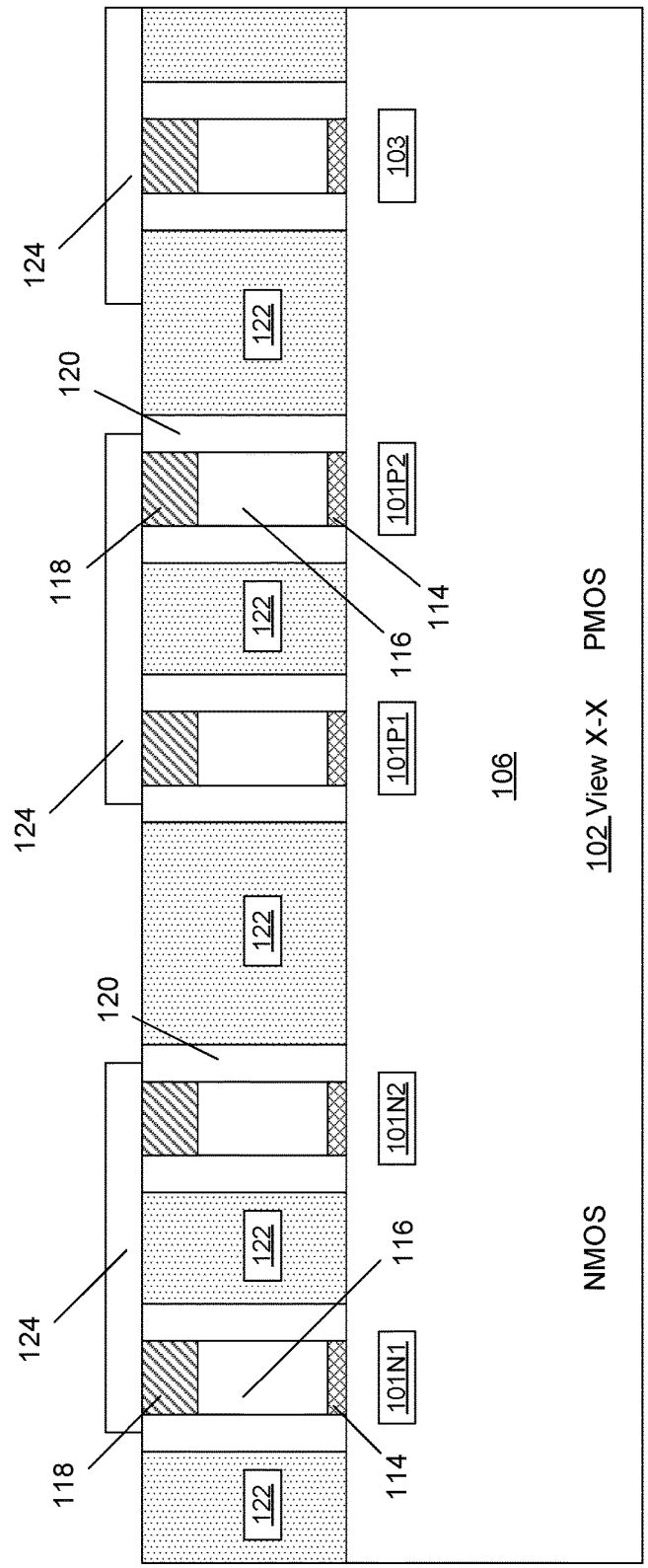
Figure 2C

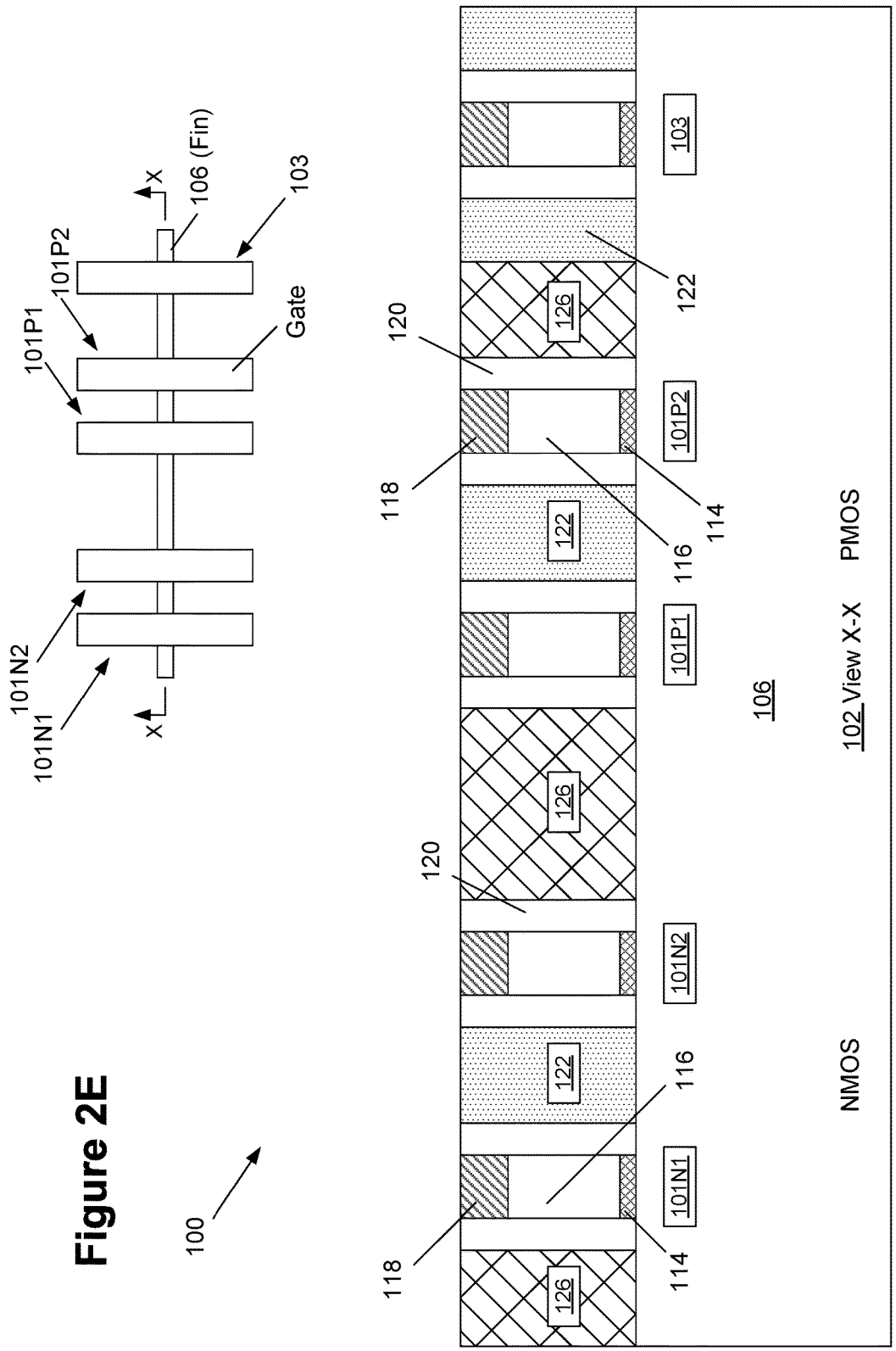

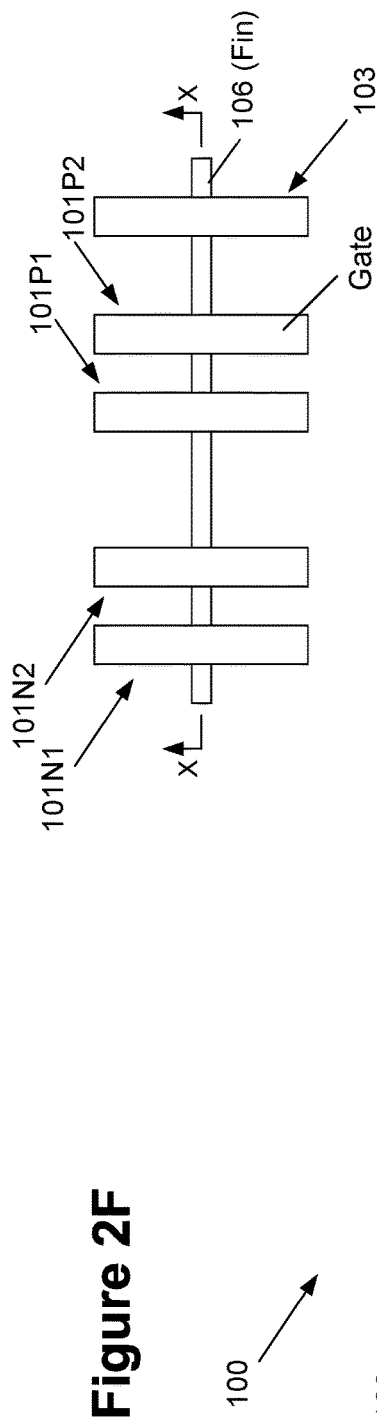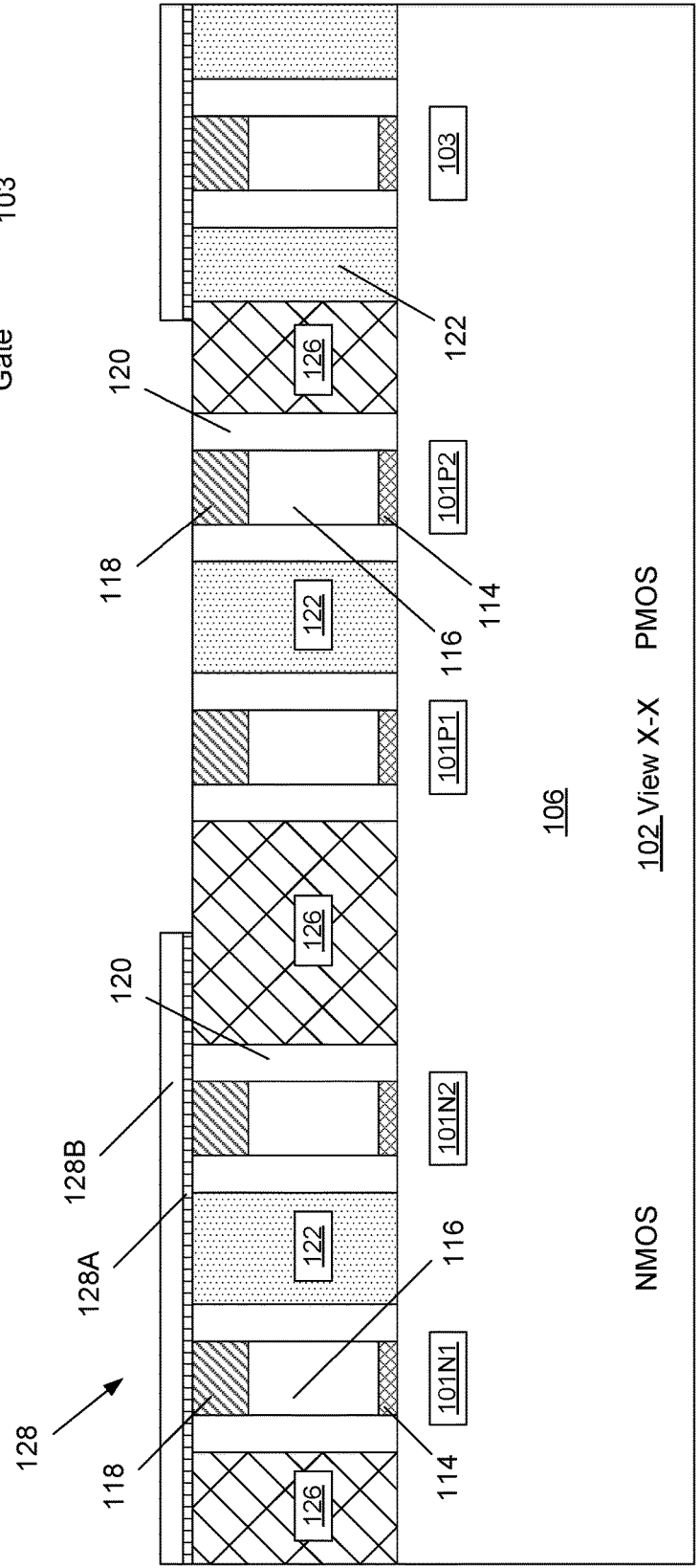
Figure 2F

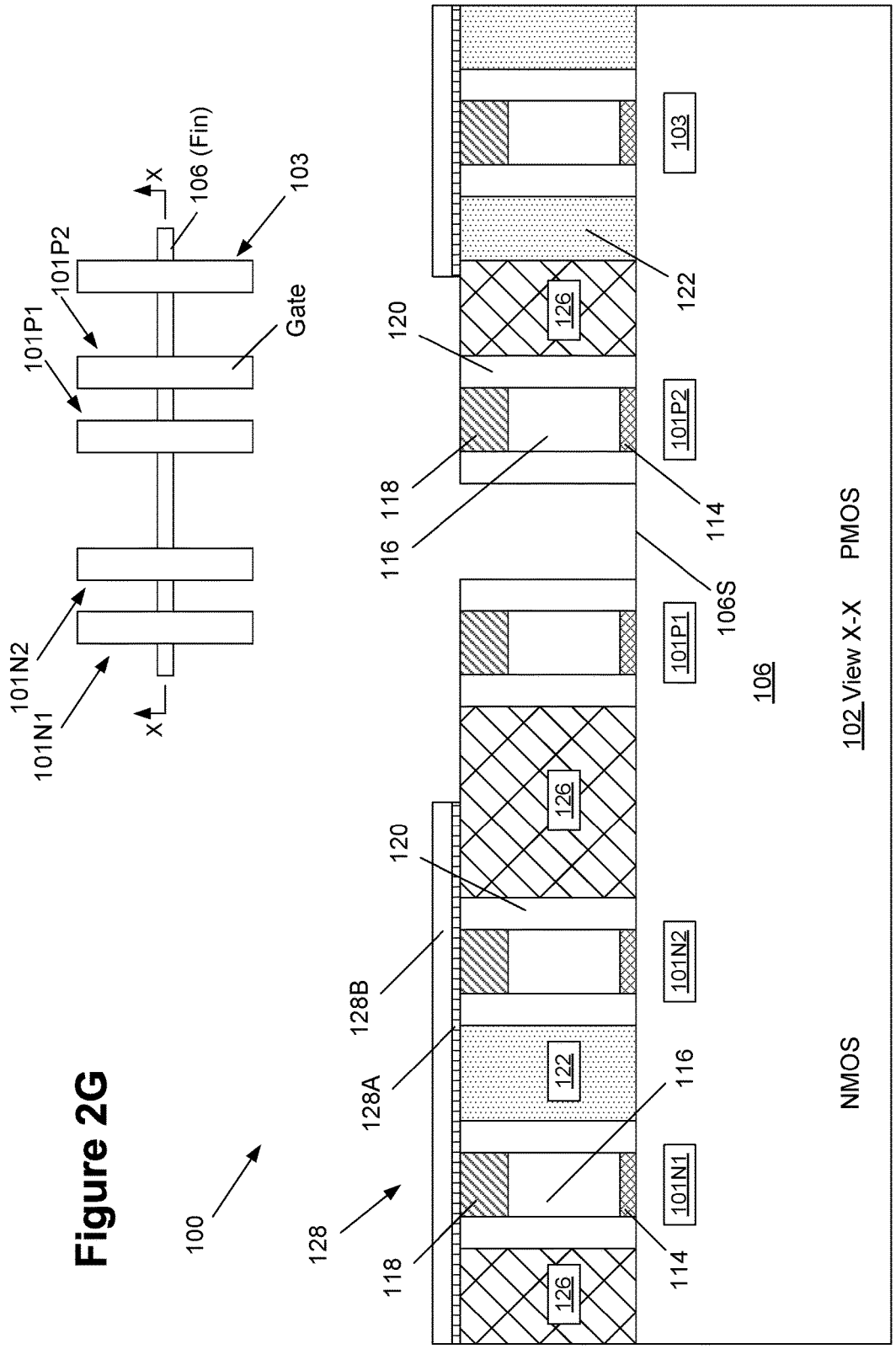

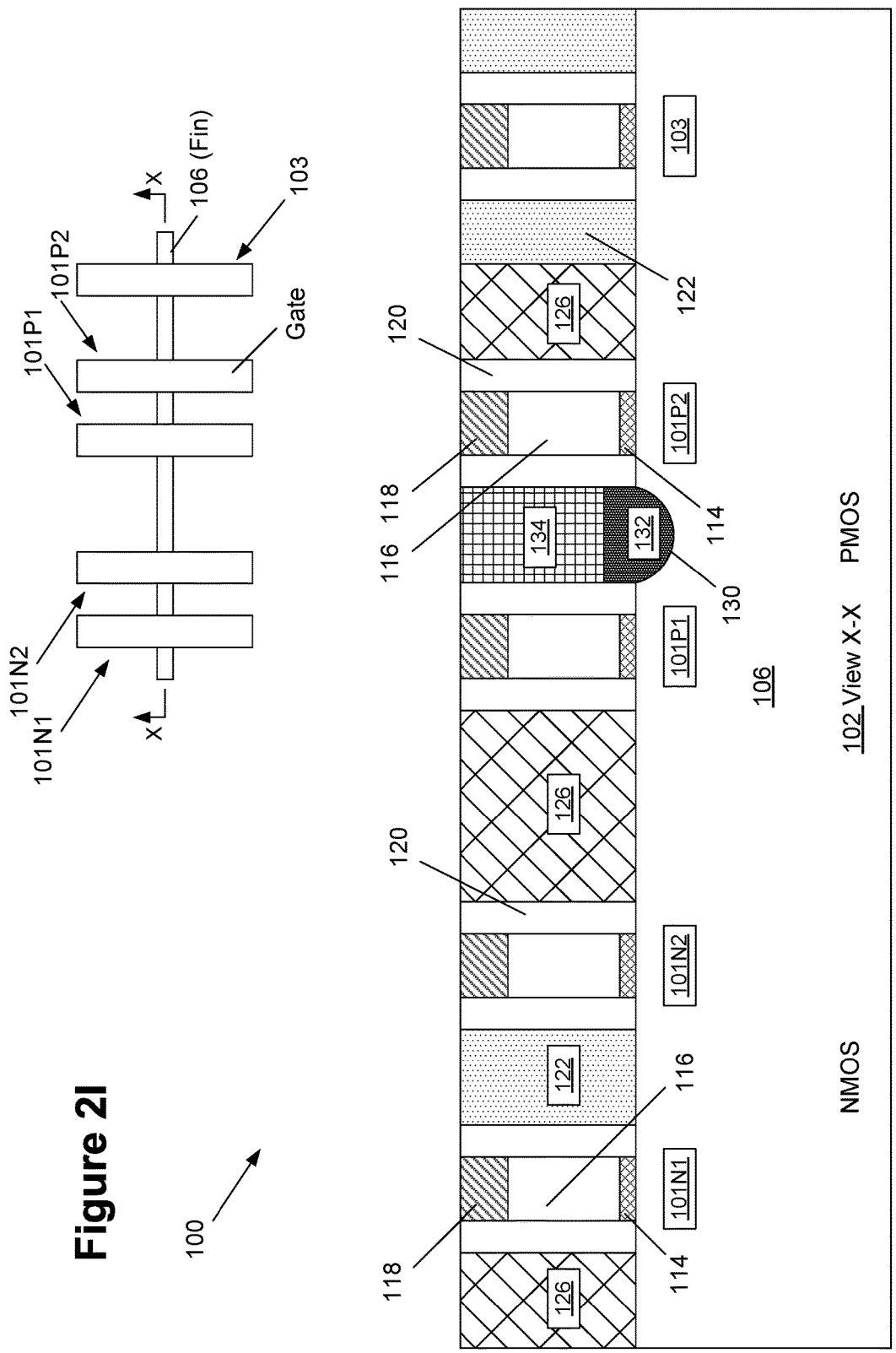

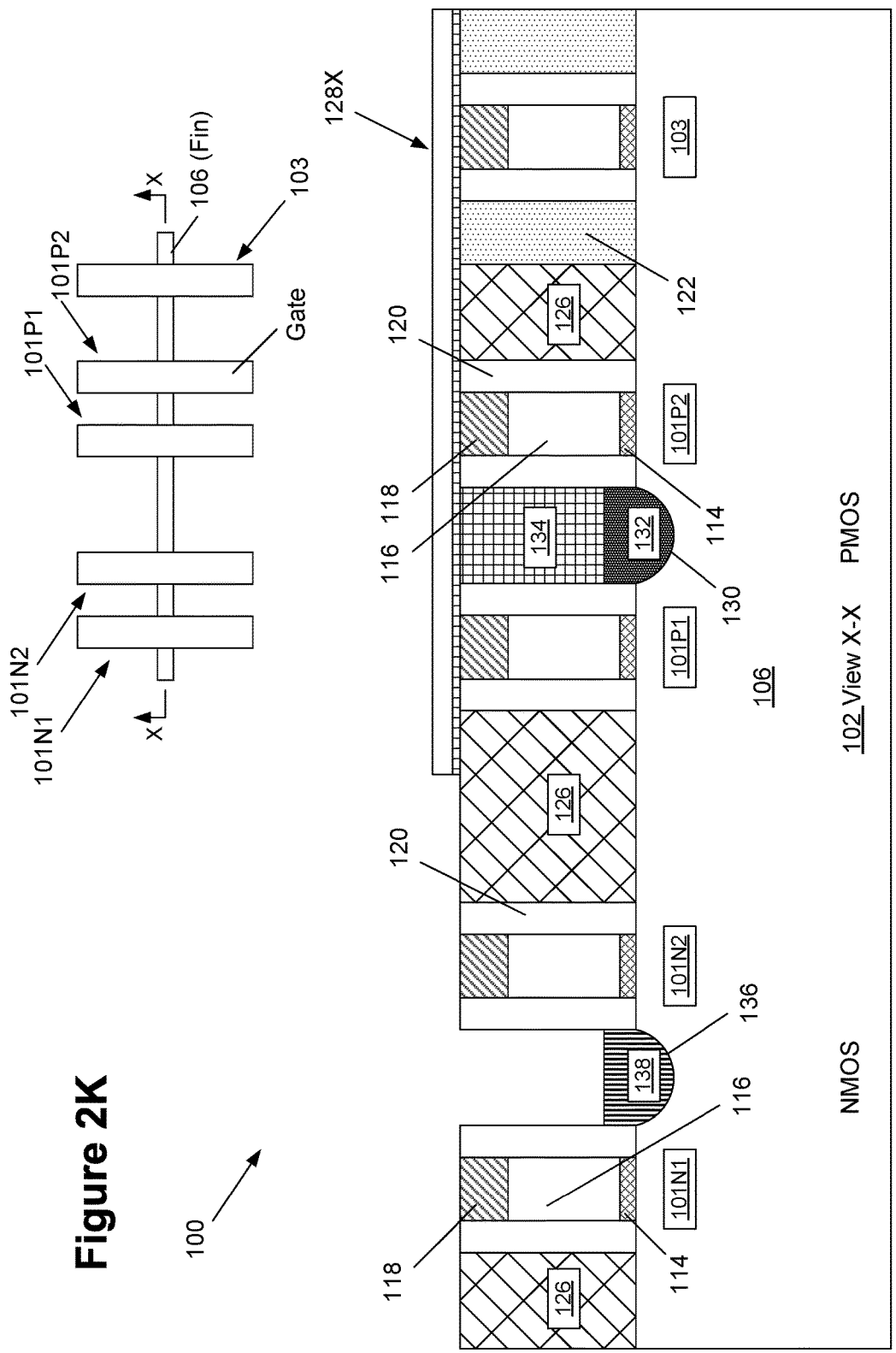

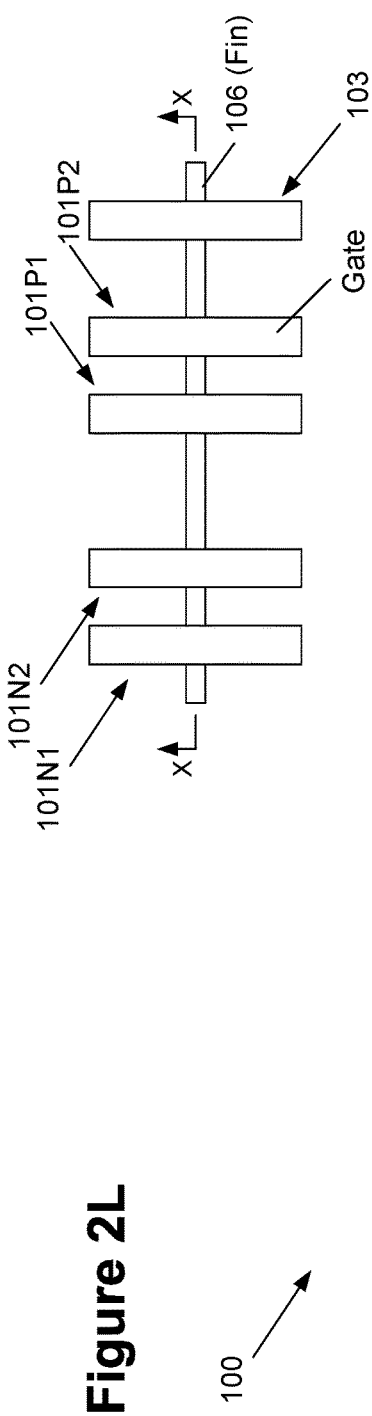
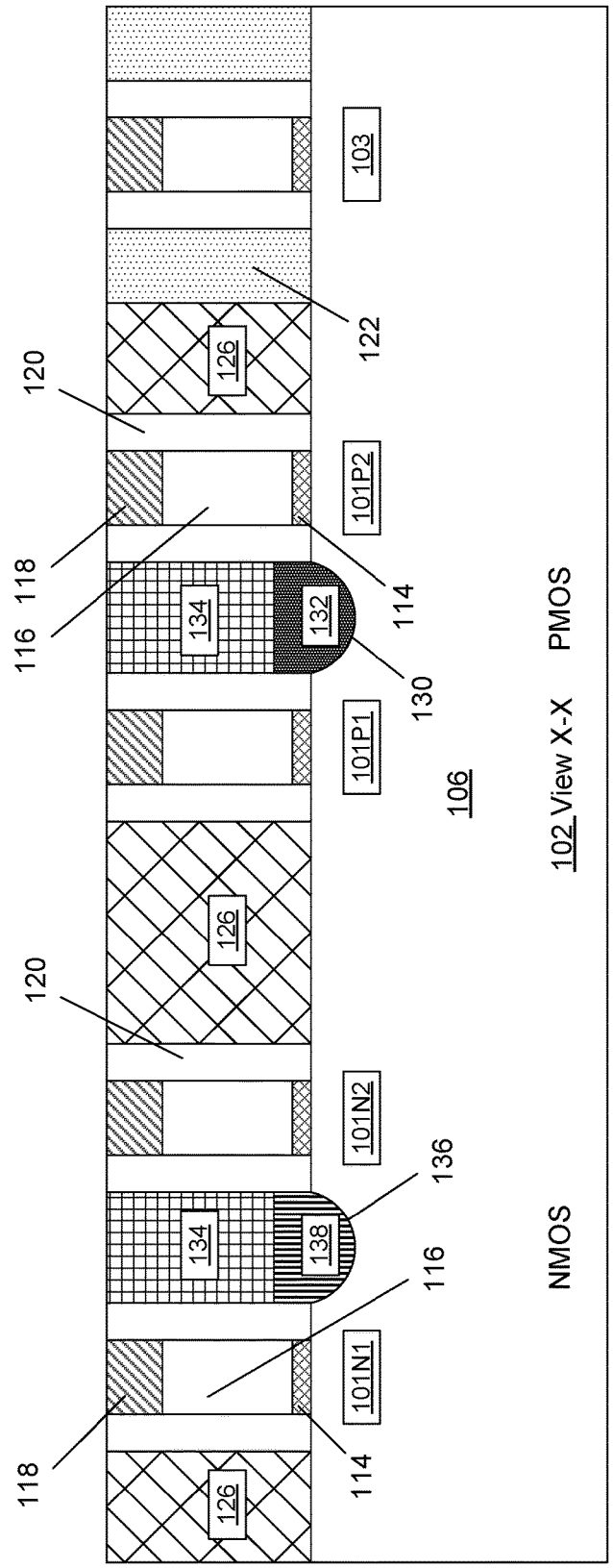
Figure 2L

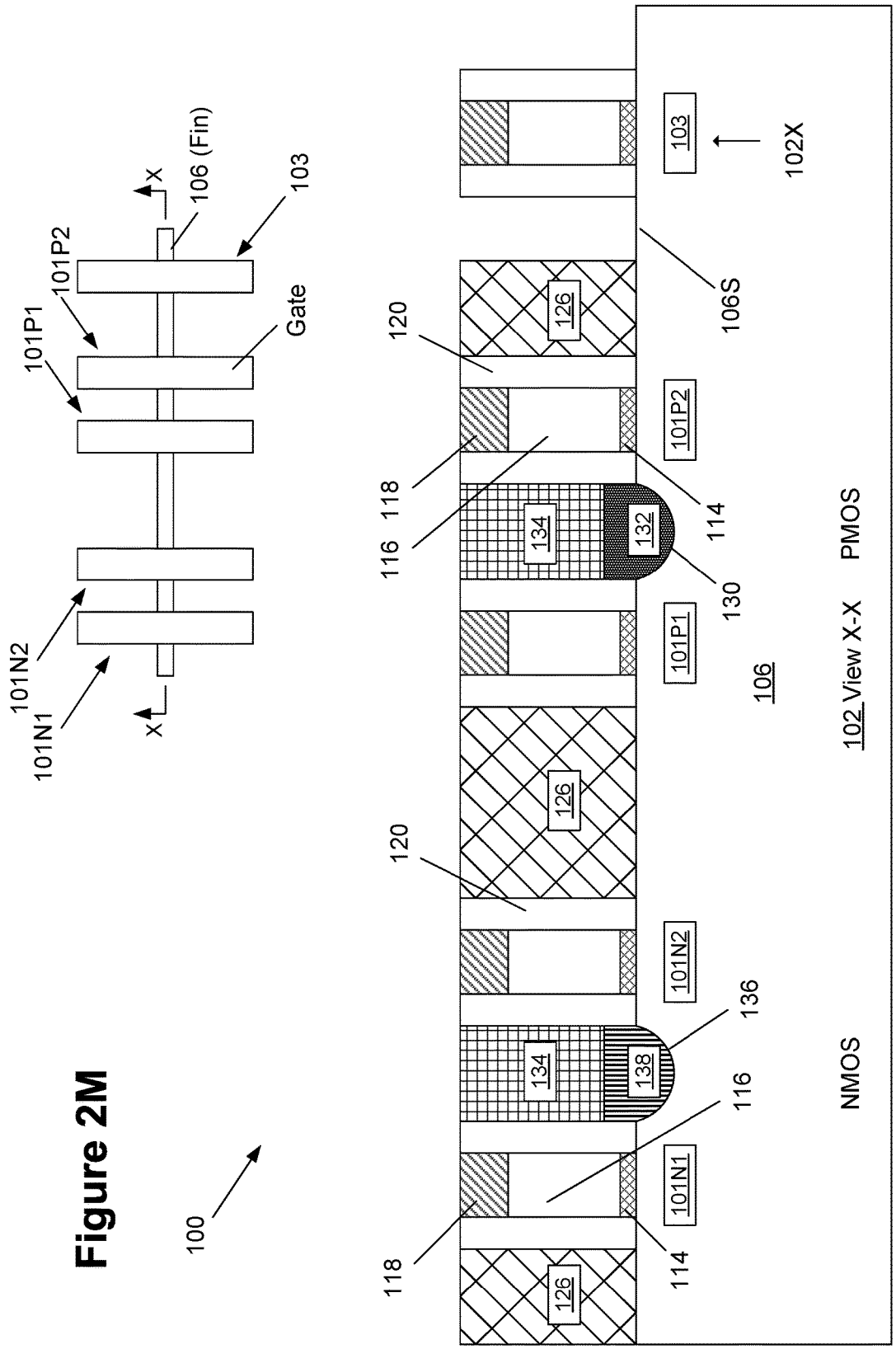

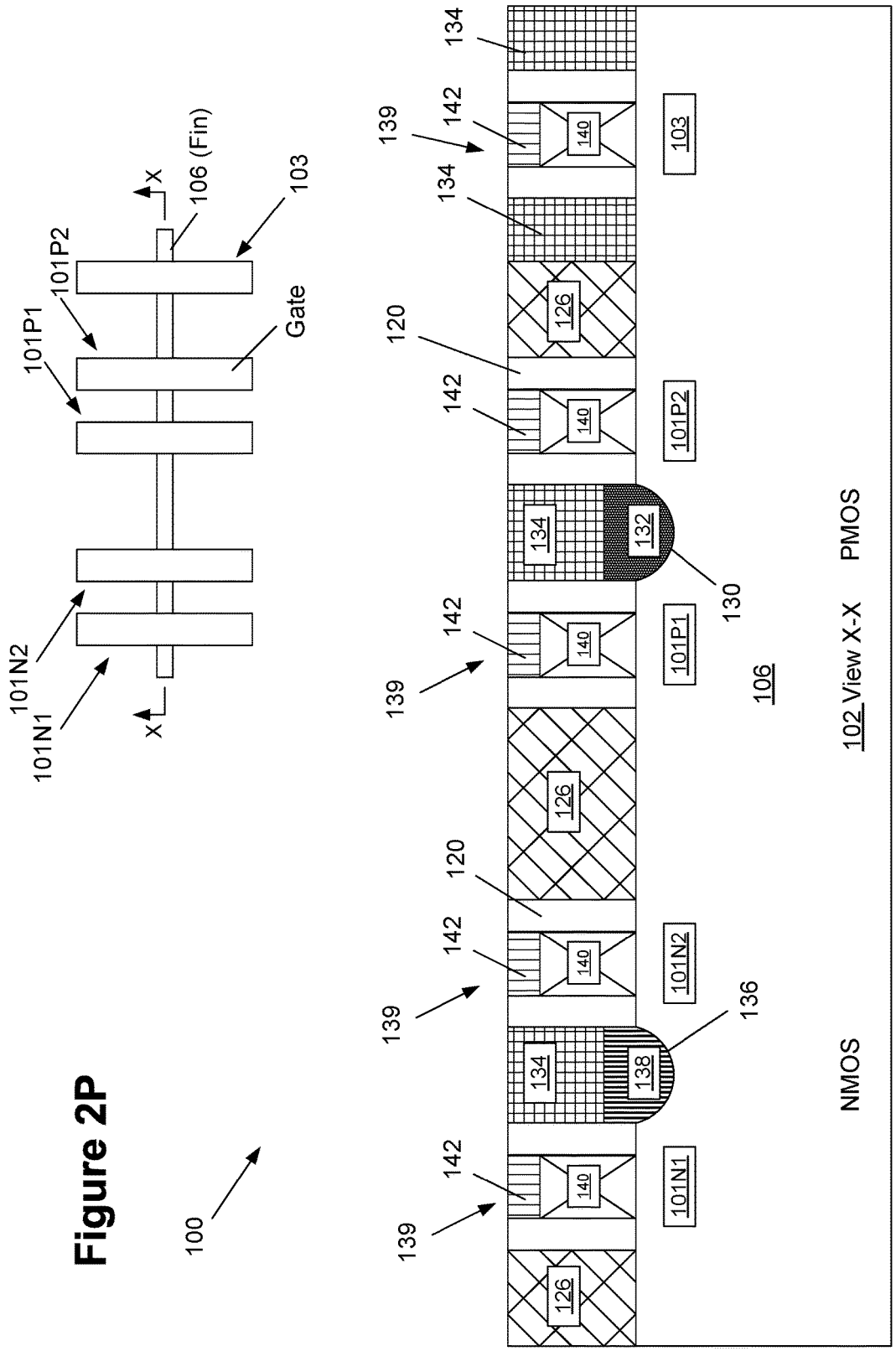

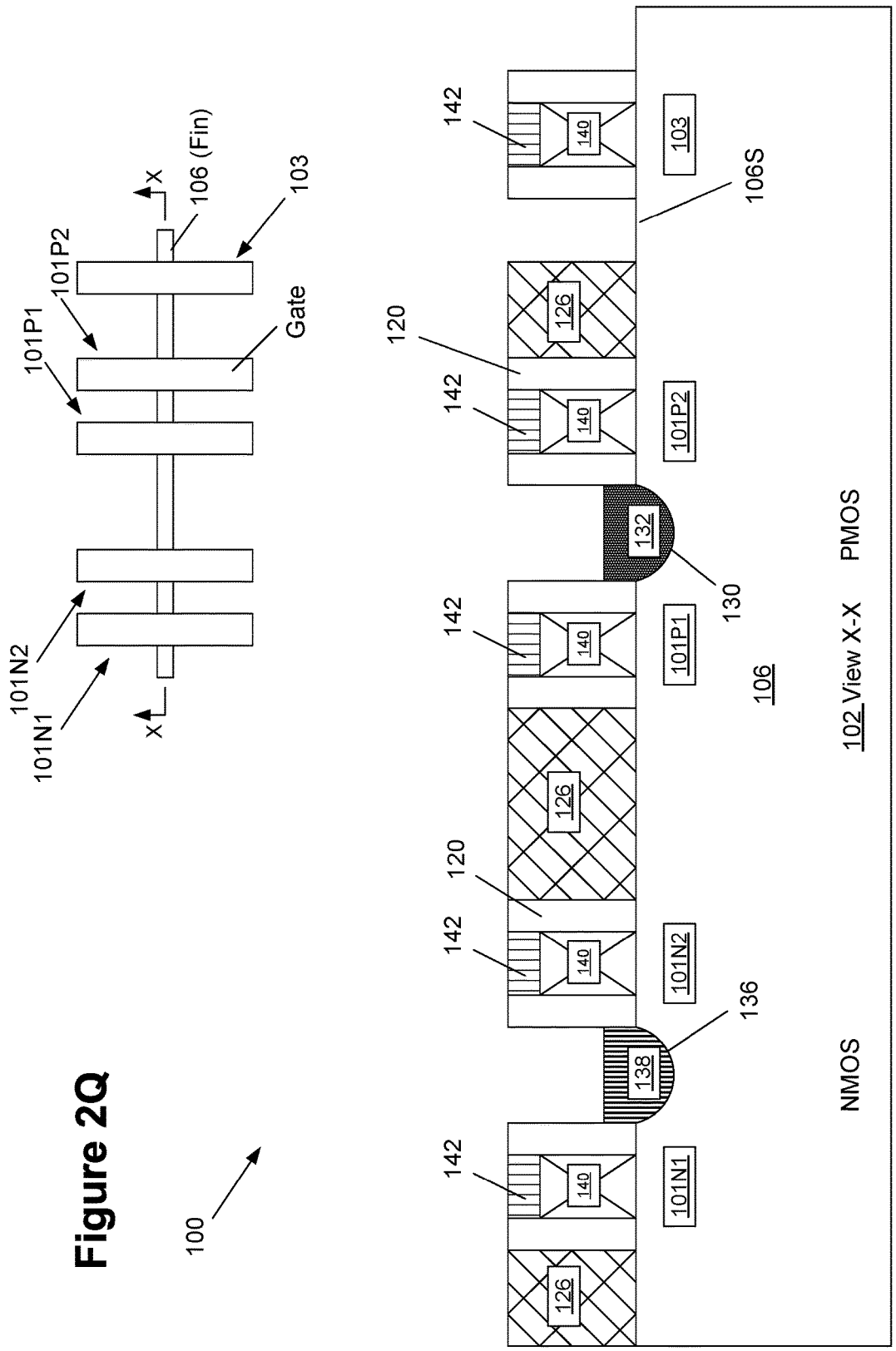

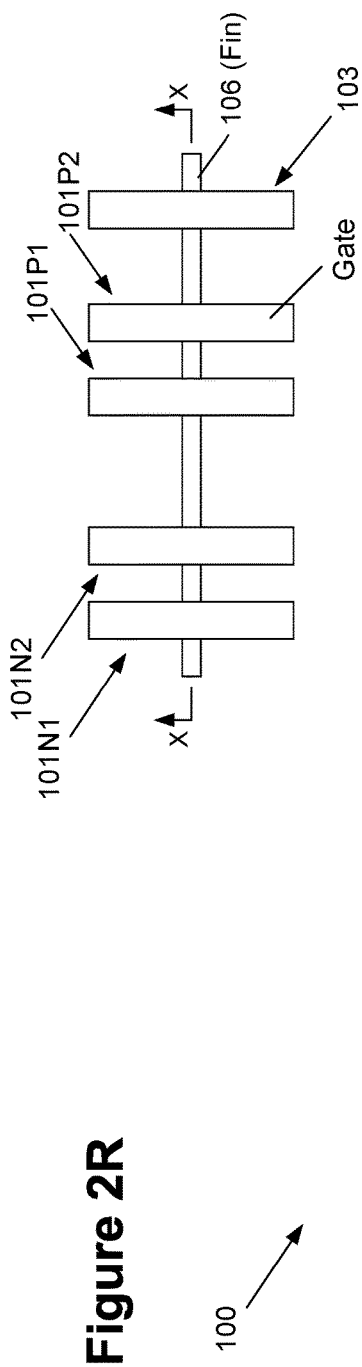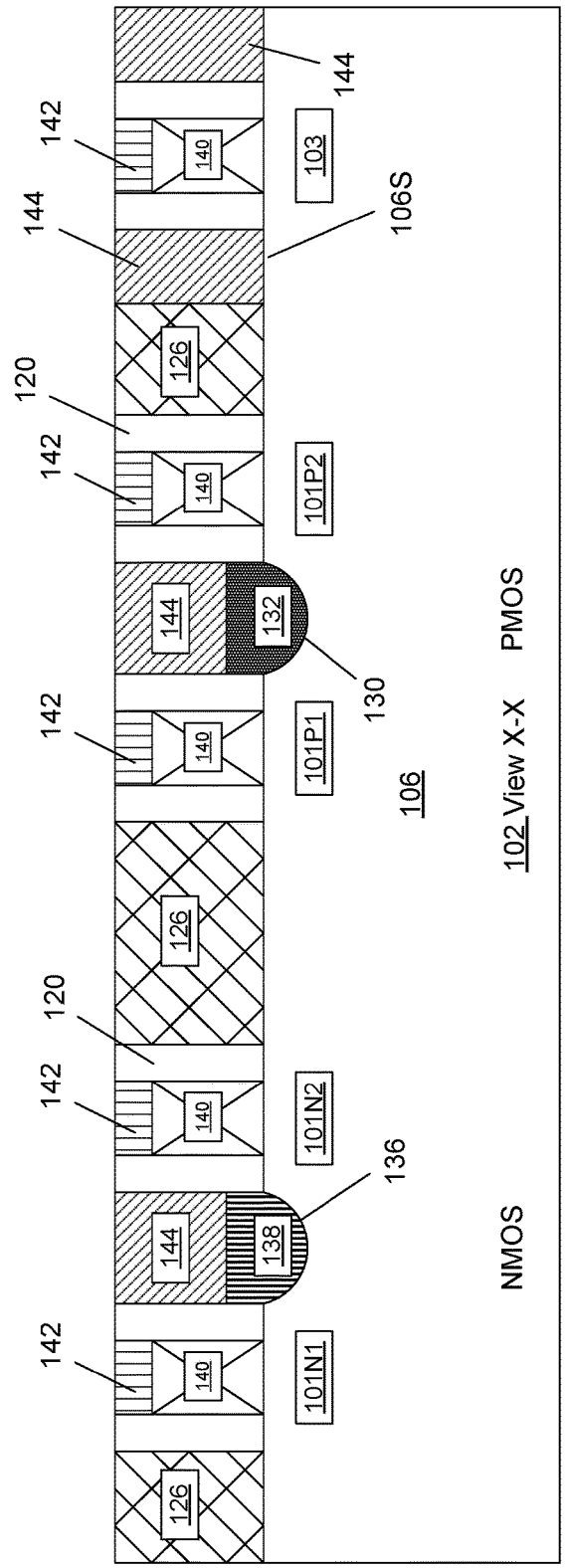
Figure 2R

METHODS OF FORMING SELF-ALIGNED CONTACTS ON FINFET DEVICES

BACKGROUND OF THE INVENTION

1. Field of the Invention

Generally, the present disclosure relates to the manufacture of semiconductor devices, and, more specifically, to various novel methods of forming self-aligned contacts on FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Comple-mentary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, a sidewall spacer 18 and a gate cap 20. Trenches 13 are formed in the substrate 12 to define the fins 14. A recessed layer of insulating material 15 is positioned under the gate structure 16 and between the fins 14 in the areas outside of the gate structure, i.e., in the source/drain regions of the device 10. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The axial length 14L corresponds to the direction of current travel, i.e., the gate length (GL) of the device 10 when it is operational. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to grow additional semiconductor material on the fins in the source/drain regions of the device 10.

FIG. 1B depicts a simplistic plan view of the traditional FinFET device 10 comprised of three illustrative fins 14. A cross-sectional view of the device 10 taken through the gate structure 16 is depicted in FIG. 1C. With reference to FIG. 1C, the device 10 includes the recessed layer of insulating material 15 positioned between the fins 14, another layer of insulating material 24 that is positioned above the gate cap layer 20, and a gate contact structure 28 that is conductively coupled to the gate structure 16. The device 10 depicted in FIG. 1C is a tri-gate (or triple gate) FinFET device. That is, during operation, a very shallow conductive region 26 (shown only on the middle fin in FIG. 1C) will be established that provides a path or channel for current to flow from the source region to the drain region. As depicted, the overall gate length (GL) of the FinFET device 10 and the overall gate width (GW) of the FinFET device 10 are all oriented in a direction that is substantially parallel to a horizontal surface 12A of the substrate 12.

For many early device technology generations, the gate electrode structures of most transistor elements were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate structures comprised of a high-k gate insulation layer (k value of 10 or greater) and one or more metal layers, a so-called high-k dielectric/metal gate (HK/MG) configuration, have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

Over recent years, due to the reduced dimensions of the transistor devices, the operating speed of the circuit components has been increased with every new device generation and the "packing density," i.e., the number of transistor devices per unit area, in such products has also increased during that time. Such improvements in the performance of transistor devices has reached the point where one limiting factor relating to the operating speed of the final integrated circuit product may no longer be the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure must be provided, a first end of which is connected to a respective contact region of a circuit element, such as a gate electrode and/or the drain and source regions of a transistor, and a second end that is connected to a respective metal line in the metallization layer by a conductive via. The contact structure may comprise contact elements or contact plugs having a generally square-like or round shape that are formed in an interlayer dielectric material, which in turn encloses and passivates the circuit elements.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structures, the gate electrode structures are used as etch masks for selectively removing the silicon dioxide material in order to expose the source/drain regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches in the form of a so-called "trench silicide" (TS) structure. Such a TS structure typically comprises a trench metal silicide material that is formed on and in contact with raised epi source/drain regions (if present) or with the fin 14 itself, and a metal material, such as tungsten, that is formed on and in contact with the trench metal silicide material.

Unfortunately, processing schemes to address at least some of the issues above may involve performing several separate deposition-CMP cycles, such as several amorphous silicon deposition-CMP process cycles. Unfortunately, the deposition and planarization of amorphous silicon is complicated, time-consuming and costly.

The present disclosure is directed to methods of forming self-aligned contacts on FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming self-aligned contacts on FinFET devices. One illustrative method disclosed herein includes, among other things, forming a first sacrificial layer comprising amorphous silicon or polysilicon material around a fin in a lateral space between a plurality of laterally spaced apart gate structures that are positioned around the fin, forming a first layer of material adjacent the plurality of laterally spaced apart gate structures and performing a first selective etching process to remove the first sacrificial layer selectively relative to the plurality of laterally spaced apart gate structures, the first layer of material and the fin so as to expose the fin in the lateral space. The method further includes forming an epi semiconductor material on the exposed portion of the fin, forming a second layer of a sacrificial material between the laterally spaced apart gate structures and above the epi semiconductor material, performing at least one second etching process to selectively remove the second layer of sacrificial material relative to at least the first layer of material to thereby define a source/drain contact opening that exposes the epi semiconductor material, and performing at least one process operation to form a self-aligned trench conductive source/drain contact structure in the source/drain contact opening that is conductively coupled to the epi semiconductor material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict an illustrative prior art FinFET device; and

Figure 2B:
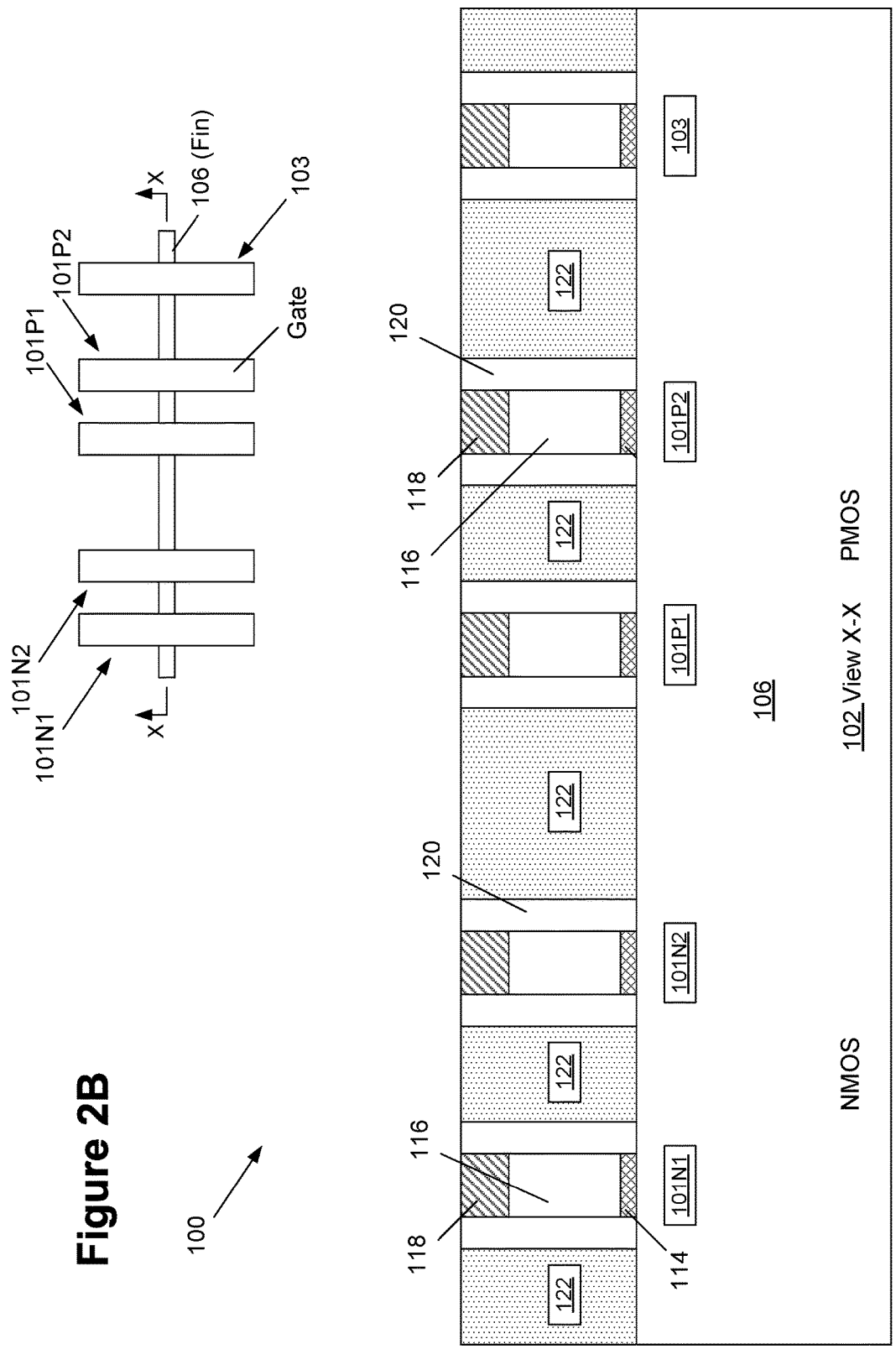
FIGS. 2A-2R depict various illustrative novel methods disclosed herein for forming self-aligned contacts on FinFET devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2R present various views of one illustrative embodiment of an integrated circuit product 100 comprised of a plurality of FinFET devices that may be formed using the novel methods disclosed herein. More specifically, in this example, two N-type FinFET devices (101N1, 101N2) are formed above a region 102N of the substrate 102 and two P-type FinFET devices (101P1, 101P2) are formed above a region 102P of the substrate 102. In the depicted example, the formation of the N-type FinFET devices and the P-type FinFET devices will involve formation of epitaxial semiconductor material in the source/drain regions of the devices. Also depicted in FIG. 2A is a non-epi device 103 (which may be either a passive device (e.g., a resistor, capacitor) or an active device (e.g., an N-type or P-type transistor device such as, for example, a FinFET device or a planar transistor device) wherein formation of the non-epi device 103 does not involve formation of epitaxial semiconductor material on the non-epi device, e.g., in the case where the non-epi device 103 is a FinFET device, there would be no epi material formed in the source/drain regions of the non-epi FinFET device 103. In the examples depicted herein, the non-epi device 103 will be depicted as being a FinFET device, but that is by way of example only and does not constitute a limitation of the presently disclosed subject matter. The non-epi device 103 is formed in a region 102X of the substrate 102. The N-type FinFET devices and the P-type FinFET devices are typically formed in different regions of the substrate 102. The cross-sectional views depicted in FIGS. 2A-2P are taken through the long axis of the fin 106, i.e., in the gate length direction of the FinFET devices. FIG. 2A depicts the product 100 at the point where the fin 106 has been formed in the substrate 102 and gate structures for all of the devices have been formed. In the examples depicted herein, the gate structures are sacrificial gate structures since the final gate structures for the FinFET devices will be formed using replacement gate manufacturing techniques. Thus, at this point in the process flow, each of the FinFET devices comprises a sacrificial gate insulating layer 114 (e.g., silicon dioxide) and a sacrificial gate electrode 116 (e.g., amorphous silicon). Also depicted are illustrative gate caps 118 (e.g., silicon nitride) and an illustrative sidewall spacer 120 (e.g., silicon nitride). The manner in which the depicted structures in FIG. 2A are formed is well known to those skilled in the art.

In the examples depicted herein, the product 100 will be formed in and above a semiconductor substrate 102. The substrate 102 may have a variety of configurations, such as a semiconductor-on-insulator (SOI) configuration that includes a bulk semiconductor layer, a buried insulation layer and an active layer. Alternatively, the substrate 102 may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2B depicts the product 100 after a sacrificial layer of silicon-containing material 122, such as amorphous silicon or polysilicon, was deposited so as to overfill the spaces between the gate structures and after a CMP process was performed to planarize the upper surface of the sacrificial layer of silicon-containing material 122 using the gate caps 118 as a polish-stop.

FIG. 2C depicts the product 100 after a patterned etch mask 124 was formed above the product 100. The patterned etch mask 124 covers the source/drain regions of the N-type devices 101N1, 101N2 and the P-type devices 101P1, 101P2 as well as the non-epi device 103. The patterned etch mask 124 may be a patterned layer of photoresist material or a patterned hard mask layer, e.g., silicon dioxide. In the examples depicted herein, the formation of only a single source/drain region in the fin 106 in the lateral space between the laterally spaced apart gate structures, e.g., the spaced apart gate structures for the two N-type devices, is depicted. The drawings also depict formation of only a self-aligned contact for each of the N-type and P-type devices. Of course, in a real-world integrated circuit product 100, the processing of the source/drain regions and the formation of the self-aligned contacts depicted herein would be performed on millions of devices at the same time on the substrate 102.

Figure 2D:
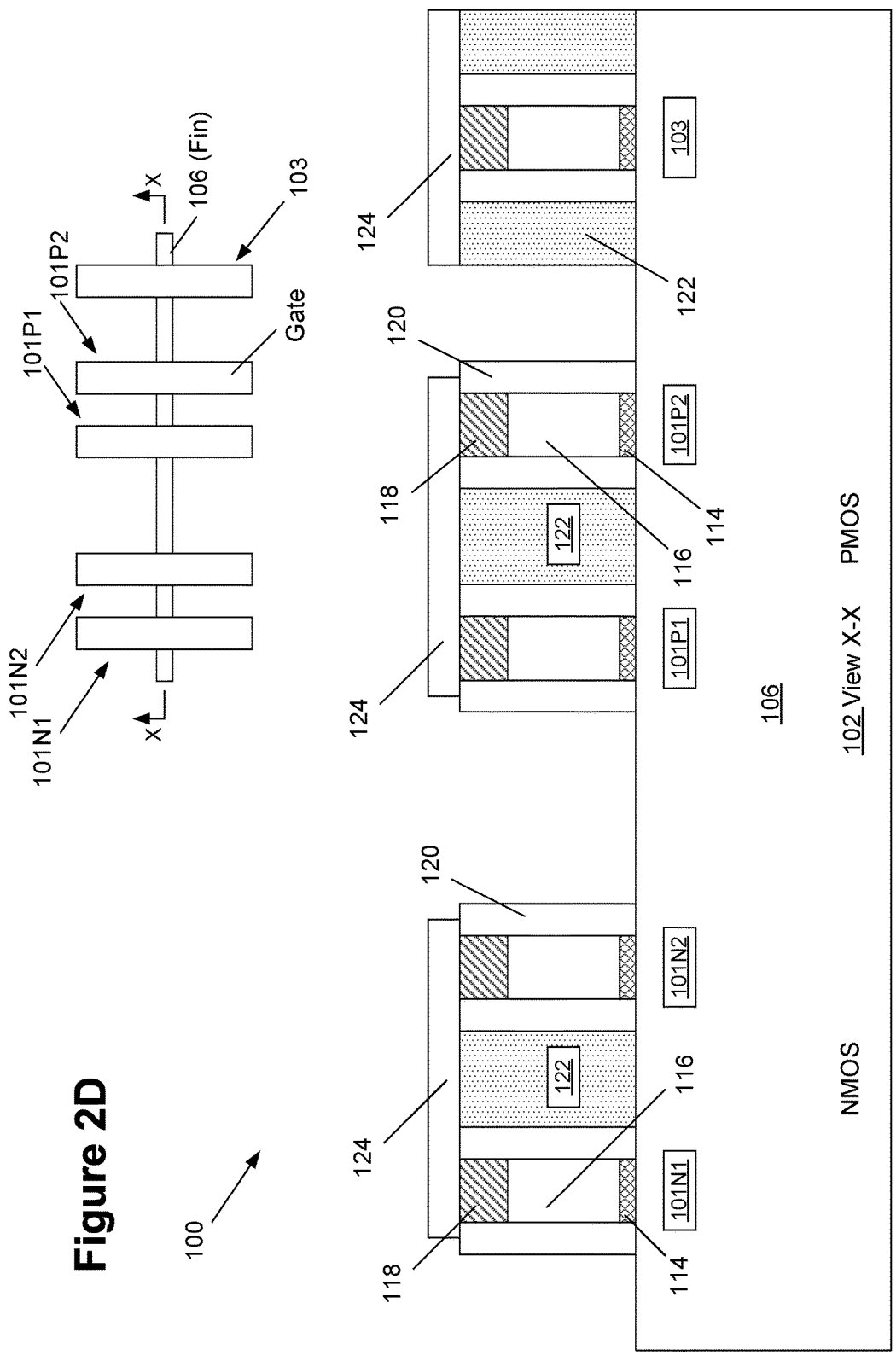

FIG. 2D depicts the product 100 after an etching process was performed through the patterned etch mask 124 to remove exposed portions of the sacrificial layer of silicon-containing material 122.

FIG. 2E depicts the product 100 after several process operations were performed. First, the patterned etch mask 124 was removed. Then, a layer of material 126 was deposited so as to overfill the spaces resulting from the removal of the exposed portions of the sacrificial layer of silicon-containing material 122 shown in FIG. 2D. Thereafter, another CMP process was performed to planarize the upper surface of the layer of material 126 using the gate caps 118 as a polish-stop. The layer of material 126 should be a material that exhibits good etch selectivity relative to the material of the gate caps 118 (e.g., silicon nitride) and a layer of flowable oxide 134 (or like material as described below) that will be formed on the product 100 at a later point in the process flow, as described more fully below. In one illustrative embodiment, the layer of material 126 may be comprised of flowable SiCO or any other material with good gap-fill capabilities that also exhibits a high resistance to a dilute HF etchant.

FIG. 2F depicts the product 100 after another patterned mask layer 128 was formed above the product 100. As depicted, the patterned mask layer 128 covers the N-type FinFET devices 101N1, 101N2 and exposes the P-type FinFET devices 101P1, 101P2 for further processing. Of course, if desired, the N-type FinFET devices could be processed prior to processing the P-type FinFET devices. The patterned mask layer 128 also covers the non-epi device 103. The patterned mask layer 128 may be a single layer of material or it may be comprised of multiple layers of material, e.g., a silicon dioxide layer 128A and a silicon nitride layer 128B.

FIG. 2G depicts the product 100 after an etching process was performed through the patterned mask layer 128 to remove exposed portions of the sacrificial layer of silicon-containing material 122. This etching process exposes the upper surface 106S (and side surfaces) of the fin 106 in the source/drain region of the P-type FinFET devices 101P1, 101P2.

Figure 2H:
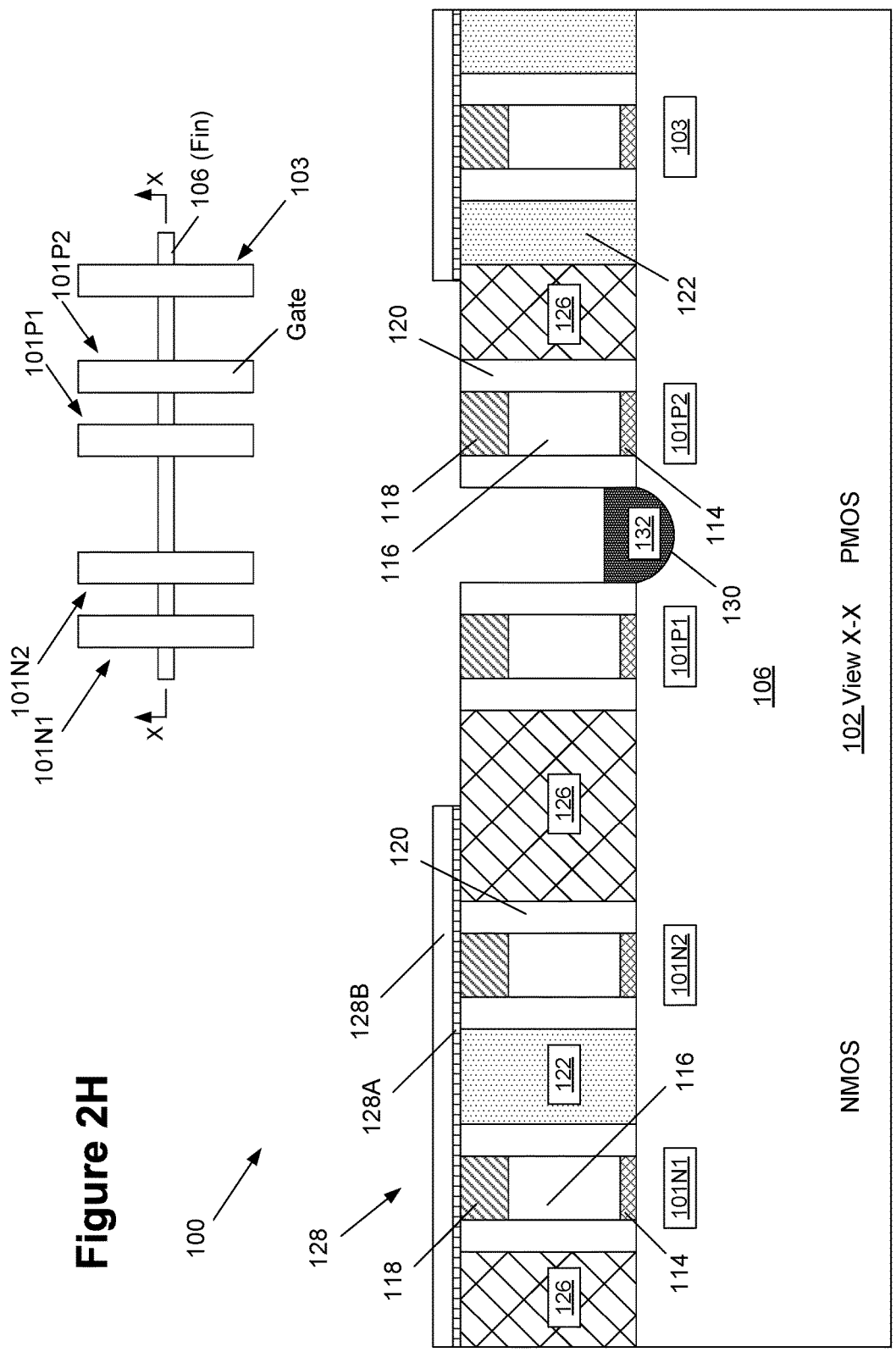

FIG. 2H depicts the product 100 after several process operations were performed. First, an etching process was performed through the patterned mask layer 128 to remove portions of the fin 106 in the source/drain region of the P-type devices 101P1, 101P2 and thereby define a trench 130. Then, an epitaxial growth process was performed to form an epi semiconductor material 132 (e.g., SiGe) in the source/drain region of the P-type FinFET devices. The epi semiconductor material 132 may be in situ doped with a P-type dopant during the formation of the epi semiconductor material 132. If desired, the epi semiconductor material 132 may be formed in such a manner so as to exert a compressive stress on the channel region of the P-type devices. Note that the non-epi device 103 is covered and not exposed to the epitaxial deposition process that is performed to form the epi semiconductor material 132.

FIG. 2I depicts the product 100 after several process operations were performed. First, the patterned mask layer 128 was removed. Then, a layer of material 134 was deposited so as to overfill the trench 130. Thereafter, another CMP process was performed to planarize the upper surface of the layer of material 134 using the gate caps 118 as a polish-stop. The layer of material 134 should be a material that exhibits good gap fill capabilities, such as a flowable silicon dioxide, a CVD silicon dioxide, a spin-on silicon dioxide, etc.

Figure 2J:
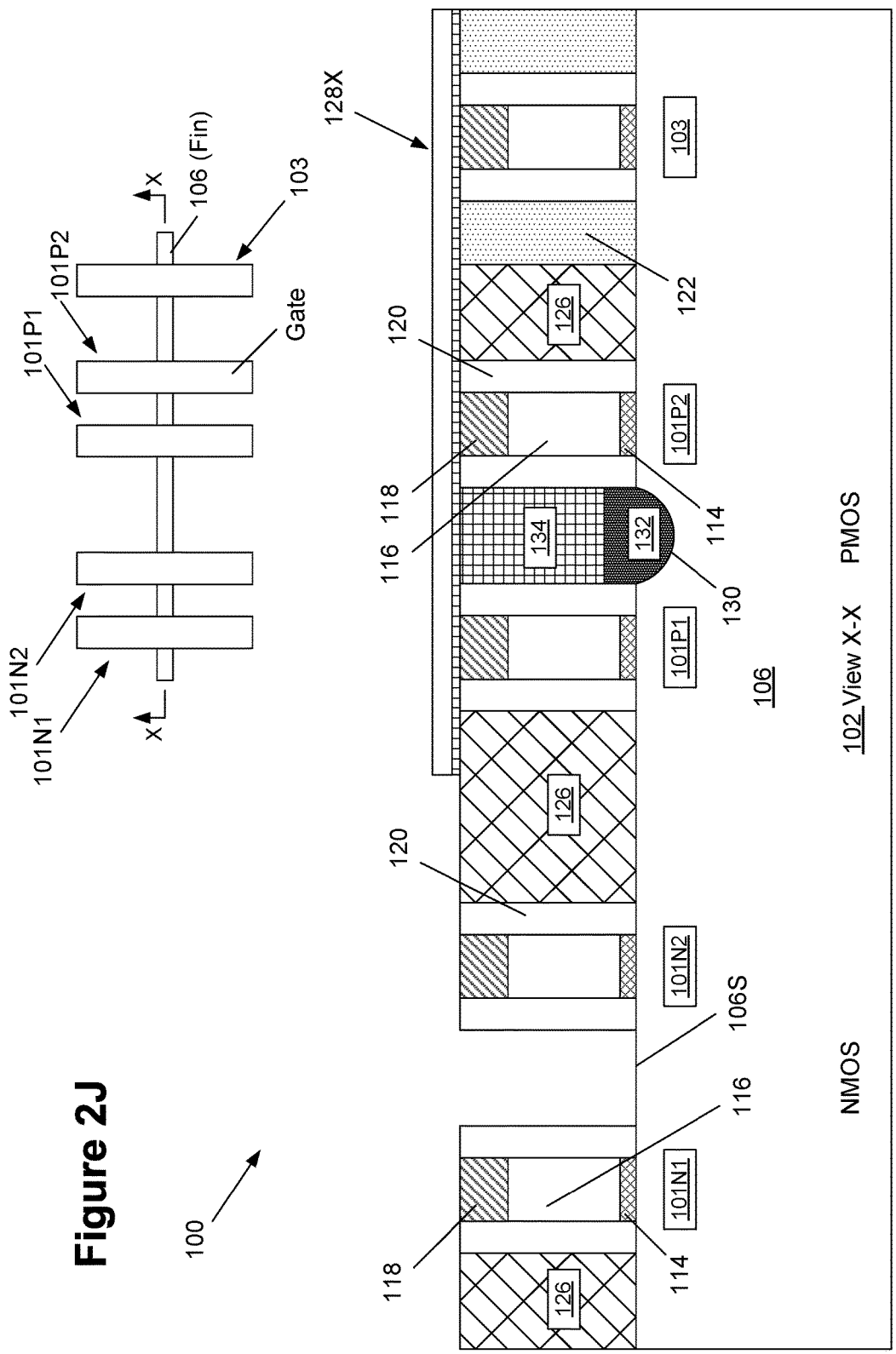

FIG. 2J depicts the product 100 after several process operations were performed. First, another patterned mask layer 128X was formed above the product 100. The patterned mask layer 128X may be comprised of the same materials as those described for the patterned mask layer 128 above. As depicted, the patterned mask layer 128X covers the P-type FinFET devices 101P1, 101P2 and exposes the N-type FinFET devices 101N1, 101N2 for further processing. The patterned mask layer 128X also covers the non-epi device 103. Next, an etching process was performed through the patterned mask layer 128X to remove exposed portions of the sacrificial layer of silicon-containing material 122 above the source/drain region of the N-type devices 101N1, 101N2. This etching process exposes the upper surface 106S (and side surfaces) of the fin 106 in the source/drain region of the N-type FinFET devices.

FIG. 2K depicts the product 100 after several process operations were performed. First, an etching process was performed through the patterned mask layer 128X to remove portions of the fin 106 in the source/drain region of the N-type devices 101N1, 101N2 and thereby define a trench 136. Then, another epitaxial growth process was performed to form an epi semiconductor material 138 (e.g., SiC) in the source/drain region of the N-type FinFET devices. The epi semiconductor material 138 may be in situ doped with an N-type dopant during the formation of the epi semiconductor material 138. If desired, the epi semiconductor material 138 may be formed in such a manner so as to exert a tensile stress on the channel region of the N-type devices. Note that the non-epi device 103 is covered and not exposed to the epitaxial deposition process that is performed to form the epi semiconductor material 138.

FIG. 2L depicts the product 100 after several process operations were performed. First, the patterned mask layer 128X was removed. Then, a second layer of material 134 was deposited so as to overfill the trench 136. Thereafter, another CMP process was performed to planarize the upper surface of this second layer of material 134 using the gate caps 118 as a polish-stop.

FIG. 2M depicts the product 100 after an etching process was performed to remove exposed portions of the sacrificial layer of silicon-containing material 122 in the area 102X of the substrate 102 where the non-epi device 103 is formed. This etching process exposes the upper surface 106S (and side surfaces) of the fin 106 in the source/drain region of the non-epi device 103.

Figure 2N:
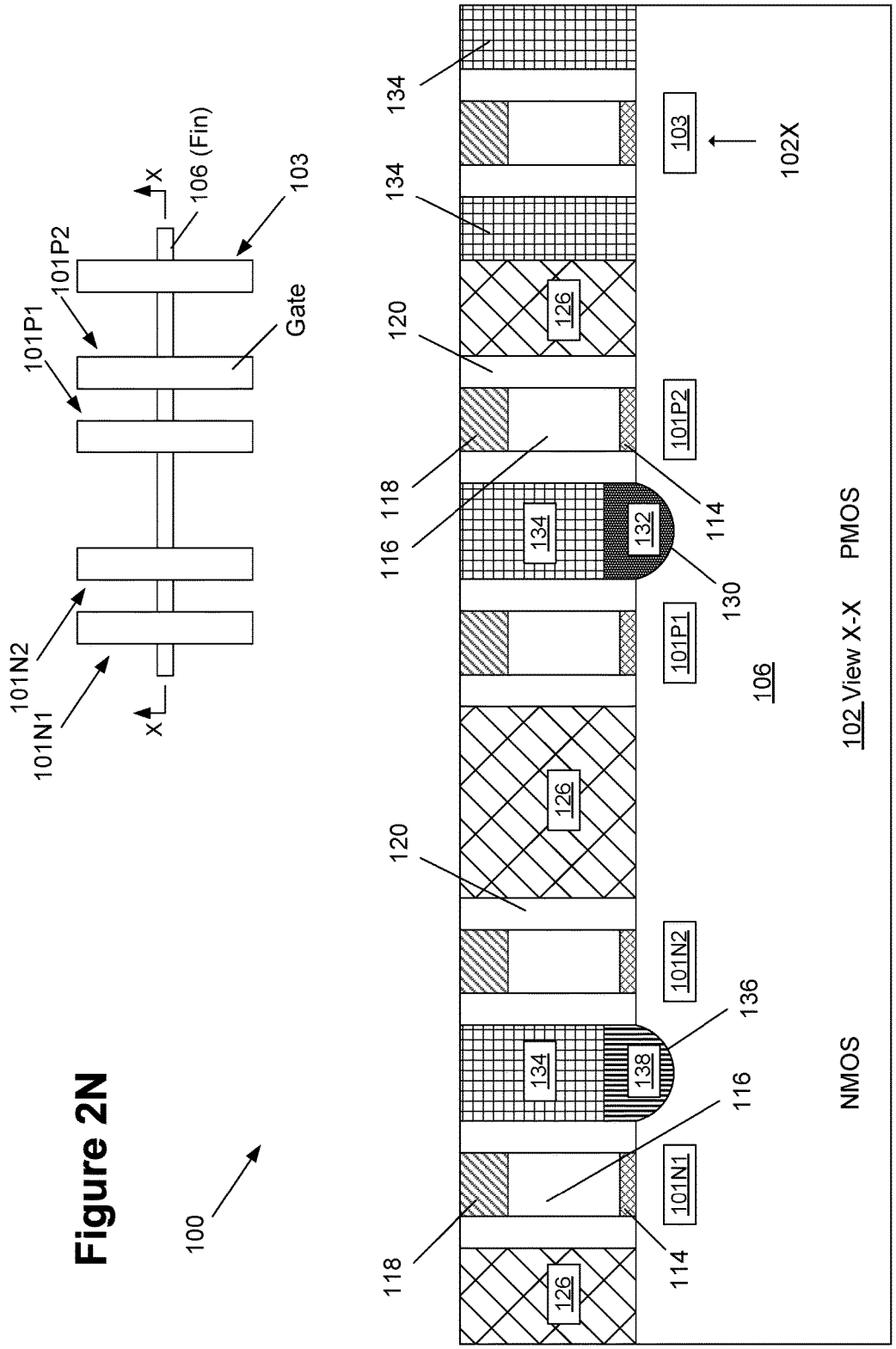

FIG. 2N depicts the product 100 after a third layer of material 134 was deposited so as to overfill the areas exposed by removing the sacrificial layer of silicon-containing material 122 in the area 102X of the substrate 102. Thereafter, another CMP process was performed to planarize the upper surface of this third layer of material 134 using the gate caps 118 as a polish-stop.

Figure 2O:
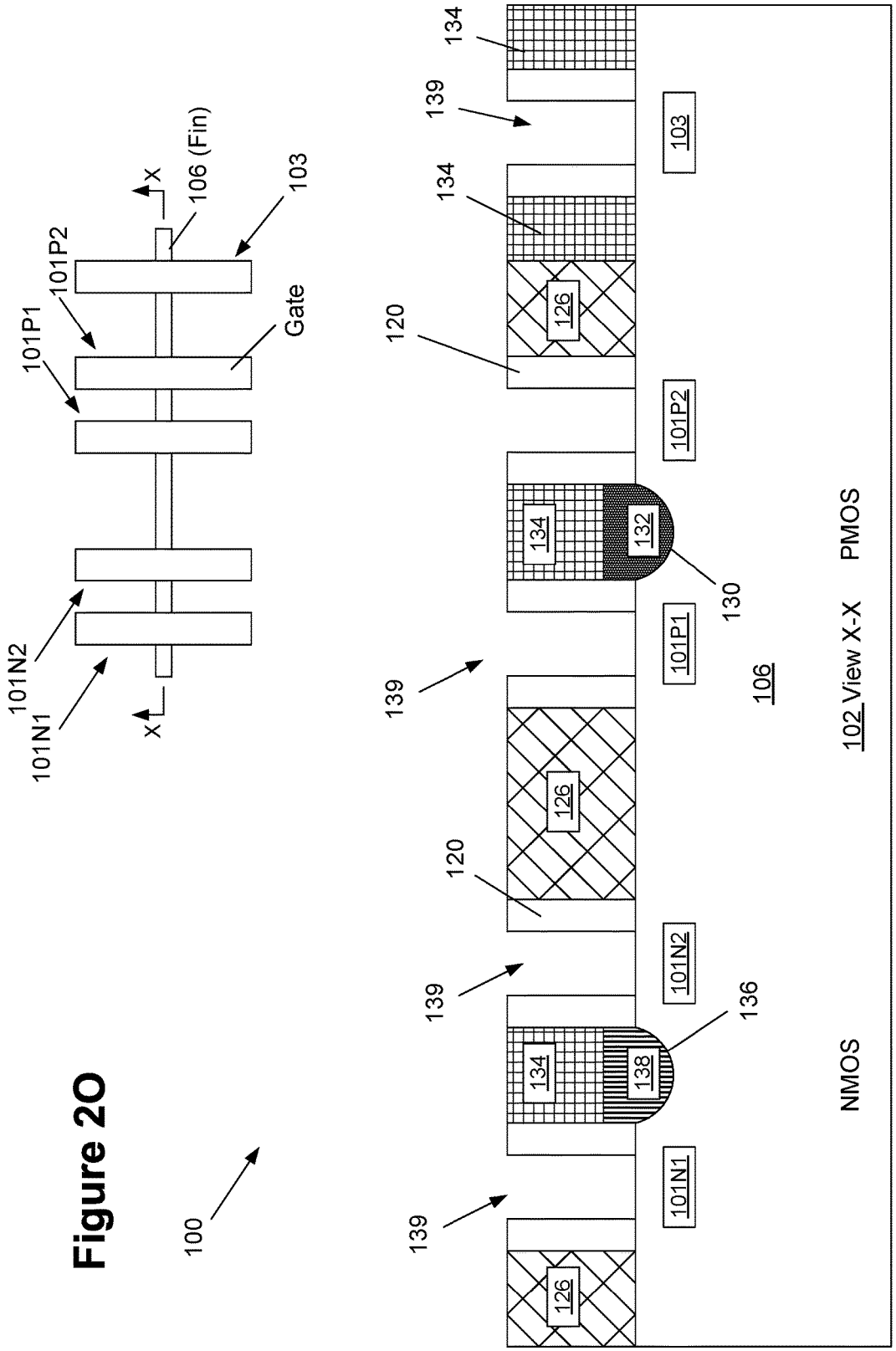

FIG. 2O depicts the product 100 after several process operations were performed. First, one or more CMP processes were performed to remove the gate caps 118 and thereby expose the upper surface of the sacrificial gate electrodes 116. The CMP process also removes portions of the spacers 120 and portions of the layers 126 and 134. Thereafter, one or more etching processes were performed to remove the sacrificial gate electrodes 116 and the sacrificial gate insulation layers 114 to thereby define a plurality of replacement gate cavities 139.

FIG. 2P depicts the product 100 after several process operations were performed. First, simplistically depicted replacement gate structures 140 were formed in the replacement gate cavities 139 using known replacement gate manufacturing techniques. Thereafter, the replacement gate materials were recessed and gate caps 142 (e.g., silicon nitride) were formed in the remaining portion of the replacement gate cavities 139. The replacement gate structures 140 typically comprise a high-k insulating material (k value greater than 10) and one or more conductive metal-containing layers of material. Of course, the materials or composition of the replacement gate structures 140 may be different for the N-type devices and the P-type devices, and they may be formed by forming appropriate masking layers at some point during the replacement gate process to mask one type of device while forming a portion of the gate structure for the exposed device type.

FIG. 2Q depicts the product 100 after an etching process, such as an HF-based wet etching process, was performed to selectively remove the silicon dioxide materials 134 relative to the surrounding materials, i.e., relative to the gate caps 142, the spacers 120, the fin 106 and the layers of material 126 (e.g., SiOC). This etching process results in the formation of source/drain contact openings and the exposure of the epi semiconductor material 138 in the source/drain regions for the N-type devices 101N1, 1012, the epi semiconductor material 132 in the source/drain regions for the P-type devices 101P1, 101P2 and the fin 106 in the source/drain regions for the non-epi device 103.

FIG. 2R depicts the product 100 after a plurality of simplistically depicted self-aligned trench conductive source/drain contact structures 144 (e.g., trench silicide structures) were formed in the source/drain contact openings for all of the devices at the same time so as to establish electrical contact to their underlying source/drain regions. Of course, the self-aligned trench conductive source/drain contact structures 144 may be comprised of any type of conductive material or materials.

Note that using the novel process flow disclosed herein, only a single deposition-planarization process is performed on a layer of amorphous silicon (e.g., the silicon-containing material layer 122). The deposition and planarization of the layers 126 and 134 is much easier to accomplish as compared to the deposition and polishing of materials such as amorphous silicon. Accordingly, the novel methods disclosed herein provide a significant reduction in processing complexity, cost and time-consumption as it relates to the formation of the above-described self-aligned contacts 144 on the various devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
    forming a first sacrificial layer comprising amorphous silicon or polysilicon material around a fin in a lateral space between a plurality of laterally spaced apart gate structures that are positioned around said fin;
    forming a first layer of material adjacent said plurality of laterally spaced apart gate structures;
    performing a first selective etching process to remove said first sacrificial layer selectively relative to said plurality of laterally spaced apart gate structures, said first layer of material and said fin so as to expose said fin in said lateral space;
    forming an epi semiconductor material on said exposed portion of said fin;
    forming a second layer of a sacrificial material between said laterally spaced apart gate structures and above said epi semiconductor material;
    performing at least one second etching process to selectively remove said second layer of sacrificial material relative to at least said first layer of material to thereby define a source/drain contact opening that exposes said epi semiconductor material; and
    performing at least on process operation to form a self-aligned trench conductive source/drain contact structure in said source/drain contact opening that is conductively coupled to said epi semiconductor material.

2. The method of claim 1, wherein said first layer of material comprises one of flowable SiOC or a material that exhibits a high degree etch resistance to dilute HF acid and said second layer of sacrificial material comprises a flowable silicon dioxide, a CVD silicon dioxide or a spin-on silicon dioxide.

3. The method of claim 1, wherein performing said at least one second etching process comprises performing an HF-based wet etching process.

4. The method of claim 1, wherein forming said self-aligned trench conductive source/drain contact structure comprises forming a trench silicide structure.

5. The method of claim 1, wherein, prior to forming said epi semiconductor material, the method comprises:
    forming an epi masking layer so as to cover a non-epi device so as not to form said epi semiconductor material on said non-epi device; and
    forming said epi semiconductor material with said epi masking layer in position above said non-epi device.

6. The method of claim 5, wherein performing said at least one second etching process to selectively remove said second layer of sacrificial material relative to at least said first layer of material further defines a second contact opening that exposes a portion of said non-epi device.

7. The method of claim 6, wherein performing said at least one process operation to form said self-aligned trench conductive source/drain contact structure in said source/drain contact opening further forms a second self-aligned trench conductive contact structure in said second contact opening that is conductively coupled to said exposed portion of said non-epi device.

8. The method of claim 5, wherein said non-epi device comprises one of an active semiconductor device or a passive semiconductor device.

9. The method of claim 8, wherein said active semiconductor device comprises one of a FinFET device and a planar transistor device and wherein said passive semiconductor device comprises one of a resistor or a capacitor.

10. A method of forming a FinFET device, comprising:
    forming a first sacrificial layer comprising amorphous silicon or polysilicon material around a fin in a lateral space between a plurality of laterally spaced apart gate structures that are positioned around said fin;
    forming a first layer of material adjacent said plurality of laterally spaced apart gate structures, wherein said first layer of material comprises one of flowable SiOC or a material that exhibits a high degree etch resistance to dilute HF acid;
    performing a first selective etching process to remove said first sacrificial layer selectively relative to said plurality of laterally spaced apart gate structures, said first layer of material and said fin so as to expose said fin in said lateral space;

forming an epi semiconductor material on said exposed portion of said fin;

forming a second layer of a sacrificial material between said laterally spaced apart gate structures and above said epi semiconductor material, wherein said second layer of sacrificial material comprises a flowable silicon dioxide, a CVD silicon dioxide or a spin-on silicon dioxide;

performing an HF-based wet etching process to selectively remove said second layer of sacrificial material relative to at least said first layer of material to thereby define a source/drain contact opening that exposes said epi semiconductor material; and performing at least one process operation to form a self-aligned trench conductive source/drain contact structure in said source/drain contact opening that is conductively coupled to said epi semiconductor material.

11. The method of claim 10, wherein forming said self-aligned trench conductive source/drain contact structure comprises forming a trench silicide structure.

12. The method of claim 10, wherein, prior to forming said epi semiconductor material, the method comprises:
forming an epi masking layer so as to cover a non-epi device so as not to form said epi semiconductor material on said non-epi device; and
forming said epi semiconductor material with said epi masking layer in position above said non-epi device.

13. The method of claim 12, wherein performing said at least one second etching process to selectively remove said second layer of sacrificial material relative to at least said first layer of material further defines a second contact opening that exposes a portion of said non-epi device.

14. The method of claim 13, wherein performing said at least one process operation to form said self-aligned trench conductive source/drain contact structure in said source/drain contact opening further forms a second self-aligned trench conductive contact structure in said second contact opening that is conductively coupled to said exposed portion of said non-epi device.

15. A method of forming a FinFET device, comprising:
forming a plurality of trenches in a semiconductor substrate so as to define a fin;
forming a plurality of laterally spaced apart gate structures around said fin, wherein each of said gate structures comprises a first gate cap, a sidewall spacer and a sacrificial gate structure;
forming a first sacrificial layer comprising amorphous silicon or polysilicon material around said fin in a lateral space between said laterally spaced apart gate structures;
forming a first layer of material adjacent said plurality of laterally-spaced apart gate structures;
performing a first selective etching process to remove said first sacrificial layer selectively relative to said first gate caps, said sidewall spacers, said first layer of material and said fin so as to expose said fin in said lateral space;
forming an epi semiconductor material on said exposed portion of said fin in said lateral space;
forming a second layer of a sacrificial material between said laterally spaced apart gate structures and above said epi semiconductor material;

performing a plurality of process operations to remove said first gate caps and said sacrificial gate structures so as to define a plurality of replacement gate cavities;

forming a replacement gate structure and a second gate cap in each of said replacement gate cavities;

performing at least one second etching process to selectively remove said second layer of sacrificial material relative to at least said first layer of material, said second gate caps and said sidewall spacers to thereby define a source/drain contact opening that exposes said epi semiconductor material; and forming a self-aligned trench conductive source/drain contact structure in said source/drain contact opening that is conductively coupled to said epi semiconductor material.

16. The method of claim 15, wherein said first layer of material comprises one of flowable SiOC or a material that exhibits a high degree etch resistance to dilute HF acid, said second layer of sacrificial material comprises a flowable silicon dioxide, a CVD silicon dioxide or a spin-on silicon dioxide, said first and second gate caps comprise silicon nitride and said sidewall spacers comprise silicon nitride.

17. The method of claim 15, wherein said FinFET device is one of a P-type device or an N-type device.

18. The method of claim 15, wherein:
forming said first sacrificial layer comprises performing a first deposition process so as to overfill said lateral space and performing a first planarization process on said first sacrificial layer;
forming said first layer of material comprises performing a second deposition process and performing a second planarization process on said first layer of material; and
forming said second layer of sacrificial material comprises performing a third deposition process so as to overfill a space above said epi semiconductor material between said laterally spaced apart gate structures and performing a third planarization process on said second layer of sacrificial material.

19. The method of claim 15, wherein performing said at least one second etching process comprises performing an HF-based wet etching process.

20. The method of claim 15, wherein, prior to forming said epi semiconductor material, the method comprises:
forming an epi masking layer so as to cover a non-epi FinFET device so as not to form said epi semiconductor material on said non-epi FinFET device, said non-epi FinFET device comprising a portion of said fin; and
forming said epi semiconductor material with said epi masking layer in position above said non-epi FinFET device.

21. The method of claim 20, wherein performing said at least one second etching process to selectively remove said second layer of sacrificial material relative to at least said first layer of material further defines a second source/drain contact opening that exposes said fin of said non-epi FinFET device.

22. The method of claim 21, wherein performing said at least one process operation to form said self-aligned trench conductive source/drain contact structure in said source/drain contact opening further forms a second self-aligned trench conductive source/drain contact structure in said second source/drain contact opening that is conductively coupled to said fin of said non-epi FinFET device.

* * * * *